(12) United States Patent
Lu (10) Patent No.: US 9,619,317 B1
(45) Date of Patent: Apr. 11, 2017

(54) DECODER HAVING EARLY DECODING TERMINATION DETECTION

(71) Applicant: Western Digital Technologies, Inc., Irvine, CA (US)

(72) Inventor: Guangming Lu, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 83 days.

(21) Appl. No.: 13/742,248

(22) Filed: Jan. 15, 2013

Related U.S. Application Data (60) Provisional application No. 61/738,732, filed on Dec. 18, 2012.

(51) Int. Cl.
  *G06F 11/08* (2006.01)
  *G06F 11/10* (2006.01)
  (Continued)

(52) U.S. Cl.
  CPC ..... *G06F 11/1008* (2013.01); *H03M 13/3746* (2013.01); *H03M 13/3753* (2013.01);
  (Continued)

(58) Field of Classification Search
  CPC ......... H03M 13/1102; H03M 13/1105; H03M 13/1128; H03M 13/1131; H03M 13/1137; H03M 13/114; H03M 13/1134; H03M 13/2948; H03M 13/2951; H03M 13/2975; H03M 13/35; H03M 13/37;
  (Continued)

(56) References Cited

U.S. PATENT DOCUMENTS 6,856,556 B1  2/2005 Hajeck
6,895,547 B2  5/2005 Eleftheriou et al.
(Continued)

FOREIGN PATENT DOCUMENTS

WO   2011127287 A1   10/2011

OTHER PUBLICATIONS

U.S. Appl. No. 13/918,400, filed Jun. 14, 2013, 41 pages.
(Continued)

*Primary Examiner* — Albert Decady
*Assistant Examiner* — Christian Dorman
(74) *Attorney, Agent, or Firm* — McDermott Will & Emery LLP (57) ABSTRACT

Embodiments of decoders having early decoding termination detection are disclosed. The decoders can provide for flexible and scalable decoding and early termination detection, particularly when quasi-cyclic low-density parity-check code (QC-LDPC) decoding is used. In one embodiment, a decoder iteratively decodes a data unit using a decoding matrix comprising a plurality of layers. After at least one iteration of decoding the data unit, the decoder determines whether the decoded data unit from a completed iteration and one or more layers of the plurality of layers satisfy a parity check equation. In response to determining that the decoded data unit from the completed iteration and each layer of the plurality of layers satisfy the parity check equation, the decoder terminates decoding the data unit. Advantageously, the termination of decoding of the data unit can reduce a number of iterations performed to decode the data unit.

20 Claims, 7 Drawing Sheets

(51) Int. Cl.
*H03M 13/11* (2006.01)
*H03M 13/37* (2006.01)
*H03M 13/35* (2006.01)

(52) U.S. Cl.
CPC ....... *H03M 13/114* (2013.01); *H03M 13/1131* (2013.01); *H03M 13/1137* (2013.01); *H03M 13/35* (2013.01); *H03M 13/3707* (2013.01)

(58) Field of Classification Search
CPC ......... H03M 13/3707; H03M 13/3746; H03M 13/3753; G06F 11/1004; G06F 11/1008; G06F 11/1068; G06F 11/1072
USPC ....... 714/774, 773, 763, 752, 746, 785, 781, 714/780
See application file for complete search history.

(56) References Cited

U.S. PATENT DOCUMENTS

| | | |
|---|---|---|
| 7,072,417 B1 | 7/2006 | Burd et al. |
| 7,126,857 B2 | 10/2006 | Hajeck |
| 7,346,832 B2 | 3/2008 | Richardson et al. |
| 7,395,490 B2 | 7/2008 | Richardson et al. |
| 7,430,136 B2 | 9/2008 | Merry, Jr. et al. |
| 7,447,807 B1 | 11/2008 | Merry et al. |
| 7,500,172 B2 | 3/2009 | Shen et al. |
| 7,502,256 B2 | 3/2009 | Merry, Jr. et al. |
| 7,509,441 B1 | 3/2009 | Merry et al. |
| 7,577,892 B1 | 8/2009 | He |
| 7,596,643 B2 | 9/2009 | Merry, Jr. et al. |
| 7,653,778 B2 | 1/2010 | Merry, Jr. et al. |
| 7,657,816 B2 | 2/2010 | Cohen et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,765,453 B2* | 7/2010 | Duggan ................... 714/755 |
| 7,783,950 B2 | 8/2010 | Esumi et al. |
| 7,814,393 B2 | 10/2010 | Kyung et al. |
| 7,898,855 B2 | 3/2011 | Merry, Jr. et al. |
| 7,912,991 B1 | 3/2011 | Merry et al. |
| 7,913,149 B2 | 3/2011 | Gribok et al. |
| 7,936,603 B2 | 5/2011 | Merry, Jr. et al. |
| 7,958,428 B2* | 6/2011 | Shen et al. .............. 714/755 |
| 7,962,792 B2 | 6/2011 | Diggs et al. |
| 8,010,869 B2 | 8/2011 | Wehn et al. |
| 8,037,388 B2 | 10/2011 | Heinrich et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,161,345 B2 | 4/2012 | Graef |
| 8,166,245 B2 | 4/2012 | Diggs et al. |
| 8,171,367 B2 | 5/2012 | Gao et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,347,195 B1 | 1/2013 | Varnica et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,495,479 B1 | 7/2013 | Varnica et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,661,326 B1* | 2/2014 | Li ....................... H03M 13/1128 714/800 |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 2003/0037298 A1 | 2/2003 | Eleftheriou et al. |
| 2003/0123563 A1 | 7/2003 | Lu |
| 2004/0098659 A1 | 5/2004 | Bjerke et al. |
| 2005/0204253 A1 | 9/2005 | Sukhobok et al. |
| 2005/0216821 A1 | 9/2005 | Harada |
| 2005/0246617 A1 | 11/2005 | Kyung et al. |
| 2006/0036925 A1 | 2/2006 | Kyung et al. |
| 2006/0036933 A1 | 2/2006 | Blankenship et al. |
| 2008/0172592 A1 | 7/2008 | Wehn et al. |
| 2008/0301521 A1 | 12/2008 | Gunnam et al. |
| 2009/0113256 A1 | 4/2009 | Radosavljevic et al. |
| 2009/0249159 A1 | 10/2009 | Lee et al. |
| 2009/0249160 A1 | 10/2009 | Gao et al. |
| 2010/0037121 A1 | 2/2010 | Jin et al. |
| 2010/0042891 A1* | 2/2010 | Gunnam et al. .............. 714/752 |
| 2010/0100788 A1 | 4/2010 | Yang et al. |
| 2010/0107030 A1 | 4/2010 | Graef |
| 2010/0131819 A1 | 5/2010 | Graef |
| 2010/0131824 A1* | 5/2010 | Kolze ................... 714/762 |
| 2010/0169735 A1 | 7/2010 | Biscondi et al. |
| 2010/0174849 A1 | 7/2010 | Walston et al. |
| 2010/0250793 A1 | 9/2010 | Syu |
| 2010/0275088 A1* | 10/2010 | Graef ..................... 714/752 |
| 2010/0318872 A1 | 12/2010 | Wang |
| 2011/0029756 A1 | 2/2011 | Biscondi et al. |
| 2011/0099323 A1 | 4/2011 | Syu |
| 2011/0126078 A1* | 5/2011 | Ueng et al. .................... 714/755 |
| 2011/0161770 A1 | 6/2011 | Ueng et al. |
| 2011/0179333 A1 | 7/2011 | Wesel et al. |
| 2011/0246862 A1 | 10/2011 | Graef |
| 2011/0252286 A1 | 10/2011 | Li et al. |
| 2011/0252294 A1 | 10/2011 | Ng et al. |
| 2011/0283049 A1 | 11/2011 | Kang et al. |
| 2012/0079341 A1 | 3/2012 | Wajcer et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0297267 A1 | 11/2012 | Chinnici et al. |
| 2012/0324191 A1 | 12/2012 | Strange et al. |
| 2013/0031447 A1* | 1/2013 | Sharon et al. ................ 714/785 |
| 2013/0132638 A1 | 5/2013 | Horn et al. |
| 2013/0139022 A1* | 5/2013 | Chen et al. .................... 714/752 |
| 2013/0145106 A1 | 6/2013 | Kan |
| 2013/0212447 A1 | 8/2013 | Li et al. |
| 2013/0290793 A1 | 10/2013 | Booth et al. |
| 2014/0059405 A1 | 2/2014 | Syu et al. |
| 2014/0115427 A1 | 4/2014 | Lu |
| 2014/0129895 A1* | 5/2014 | Petrov ..................... 714/752 |

OTHER PUBLICATIONS

Bernhard M.J. Leiner, "LDPC Codes—a brief Tutorial", Stud. ID: 53418L, Apr. 8, 2005, pp. 1-9.

(56) References Cited

OTHER PUBLICATIONS

U.S. Appl. No. 13/718,289, filed Dec. 18, 2012, 27 pages.
U.S. Appl. No. 13/742,243, filed Jan. 15, 2013, 28 pages.

* cited by examiner

DECODER HAVING EARLY DECODING TERMINATION DETECTION

CROSS REFERENCE TO RELATED APPLICATIONS

This application claims benefit under 35 U.S.C. §119(e) to U.S. Provisional Patent Application No. 61/738,732 entitled "DECODER HAVING EARLY DECODING TERMINATION DETECTION" filed on Dec. 18, 2012; the disclosure of which is hereby incorporated by reference in its entirety.

BACKGROUND

1. Technical Field

This disclosure relates to data storage systems for computer systems. More particularly, the disclosure relates to a decoder having early decoding termination detection.

2. Description of the Related Art

Non-volatile memory arrays often have limited endurance. The endurance of the memory array is typically contingent on usage pattern and wear. In addition, the endurance depends on a type of the non-volatile memory array used. For example, memory arrays with multi-level cell (MLC) NAND media typically have a lower endurance than memory arrays with single-level cell (SLC) NAND media. To protect user data stored to memory arrays from corruption, which may be caused by a diminished endurance, parity data can be generated and stored along with user data to facilitate error detection and/or correction. Decoding of parity data can be time consuming and resource intensive. Accordingly, it is desirable to provide more efficient mechanisms for decoding parity data.

BRIEF DESCRIPTION OF THE DRAWINGS

Systems and methods that embody the various features of the invention will now be described with reference to the following drawings, in which.

DETAILED DESCRIPTION

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

Data storage systems, such as solid state drives, typically include one or more controllers coupled with one or more non-volatile memory arrays. Depending on the type of non-volatile memory array used, stored data may be subject to corruption as a result of, for example, read/write disturbs, loss of data retention, and/or loss of endurance. Data storage systems can utilize one or more error correction or error coding mechanisms to detect and/or correct errors in the stored data. One such mechanism can determine parity data, such as parity data, when writing user data. Parity data can be stored, for example, in a memory array. When stored user data is retrieved, parity data can be utilized as part of a decoding process to determine the integrity of the retrieved user data. If one or more errors are detected, such errors may be corrected.

Iterative decoding of data can involve considerable system overhead, such as processing time overhead, system resources overhead, and/or system components overhead (e.g., necessity to use additional hardware, firmware, etc.). Accordingly, ending iterative decoding early can provide significant power and/or processing time savings for data storage systems. Moreover, storing parity data (e.g., in a memory array) can reduce memory space available for storage of user data. It can thus also be advantageous for a data storage system to support different error code rates, code lengths, and/or different coding throughput speeds. For example, a data storage system can decode stored data having a relatively higher coding rate so that less parity data is used when a non-volatile memory is early in the lifecycle and thus has relatively higher retention and/or endurance. As non-volatile memory wears out over time, the data storage system can switch to decoding lower coding rates such that more parity data is generated to protect user data from errors. However, supporting multiple code rates, lengths, and/or throughput speeds can require adding and/or duplicating system components (hardware, firmware, etc.), which can increase power consumption and processing time.

Embodiments of the present invention are directed to a decoder having early decoding termination detection. In one embodiment, the decoder can perform early decoding termination detection while supporting multiple error code rates and/or error code lengths, by using nominal or no redundancy of system components. For example, an early detection module of the decoder can be configured so that the existing detection components can be used and/or reused for supporting various code rates and/or lengths. The early detection module can further support multiple error coding throughput speeds by, for example, utilizing parallel computation techniques. In other words, the architecture of the early detection module can be scalable and/or flexible. Accordingly, decoding efficiency and, consequently, data storage system performance can be increased without a substantial increase in the number and/or size of system components in data decoding. Moreover, power consumption and data processing time can be reduced by reducing the number of iterations for decoding data.

System Overview

Figure 1:
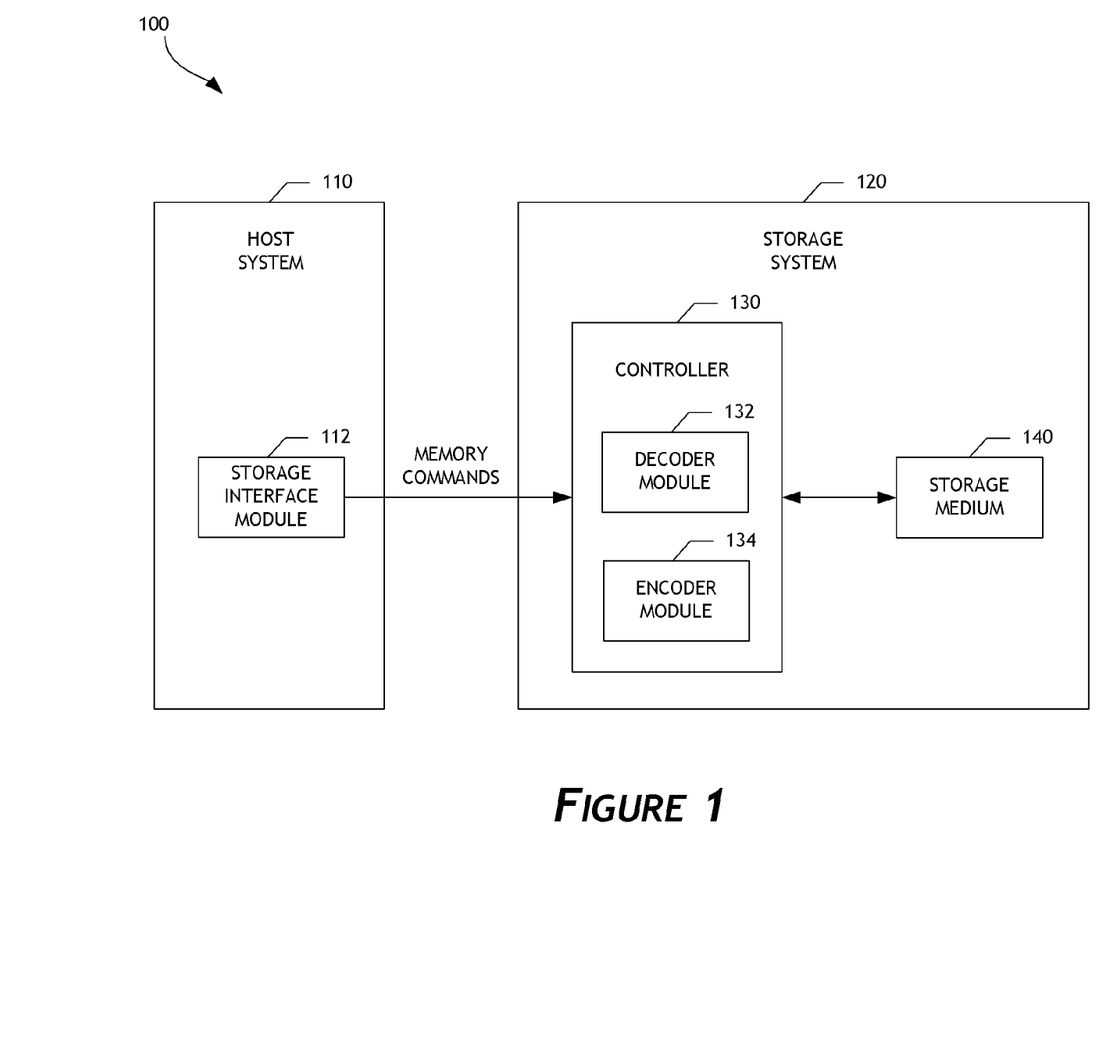
FIG. 1 illustrates a combination of a host system and a data storage system that implements a decoder having early decoding termination detection according to one embodiment of the invention.

FIG. 1 illustrates a combination 100 of a host system 110 and a data storage system 120 that implements a decoder having early decoding termination detection according to one embodiment of the invention. As is shown, the data storage system 120 (e.g., hybrid hard drive, solid state drive, etc.) includes a controller 130 and a storage medium 140.

The storage medium 140 may comprise an array of non-volatile memory, such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof. In some embodiments, the data storage system 120 can further comprise other types of storage, such as one or more magnetic media storage modules or other types of storage modules.

The controller 130 can be configured to receive data and/or storage access commands from a storage interface module 112 (e.g., a device driver) of the host system 110. Storage access commands communicated by the storage interface module 112 can include write data and read data commands issued by the host system 110. Read and write commands can specify a logical address (e.g., logical block addresses or LBAs) used to access the data storage system 120. The controller 130 can execute the received commands in the storage medium 140.

Data storage system 120 can store data communicated by the host system 110. In other words, the data storage system 120 can act as memory storage for the host system 110. To facilitate this function, the controller 130 can implement a logical interface. The logical interface can present to the host system 110 data storage system memory as a set of logical addresses (e.g., contiguous address) where user data can be stored. Internally, the controller 130 can map logical addresses to various physical locations or addresses in the storage medium 140 and/or other storage modules.

The controller 130 includes a decoder module 132 and an encoder module 134 configured to decode and encode data, respectively, stored in and retrieved from the storage medium 140. The decoder module 132 can further determine integrity of data retrieved from the storage medium 140 and perform, if necessary, error correction of retrieved data. In some embodiments, when the storage medium 140 is early in the lifecycle and thus has relatively higher retention and/or endurance, the controller 130 can direct the encoder module 134 to encode data using a relatively higher coding rate so that less parity data is used. As the storage medium 140 wears out over time, the controller 130 can direct the encoder module 134 to switch to lower encoding rates such that more parity data is generated to protect user data from errors. The controller 130 can store the coding rates for encoded data in the storage medium 140 or another storage module (not shown) so that the decoder module 132 can later access the information to decode the encoded data.

Overview of Low-Density Parity-Check (LDPC) Coding

In one embodiment, the decoder module 132 and the encoder module 134 can utilize low-density parity-check (LDPC) codes for decoding and/or generating parity data, respectively. LDPC codes can be decoded using a decoding matrix H and generated using a corresponding generating matrix G.

Figure 2:
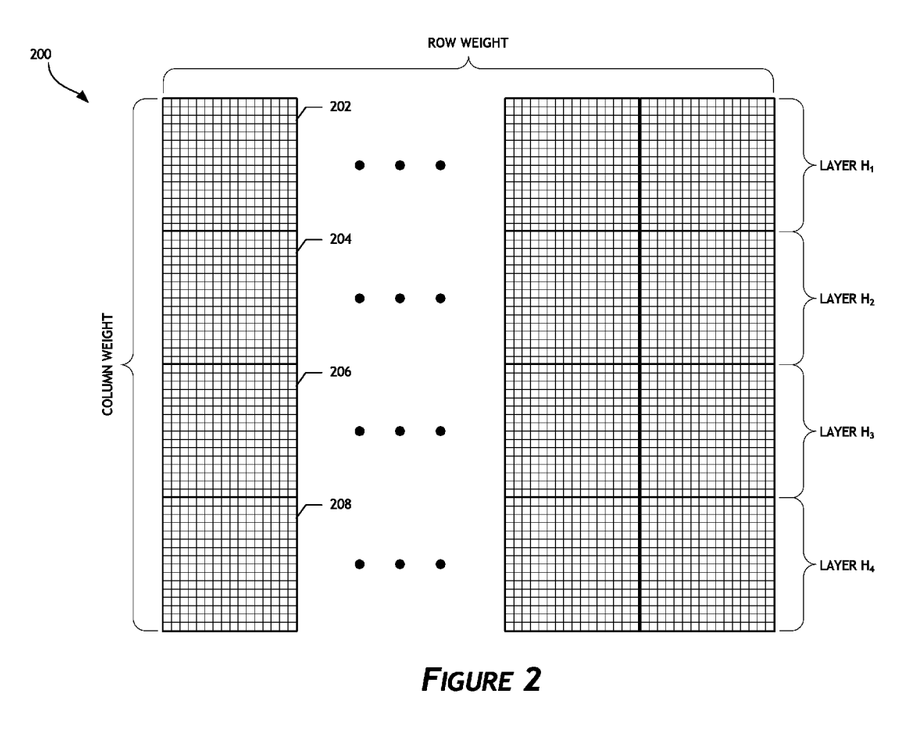
FIG. 2 illustrates a decoding matrix used for decoding data according to one embodiment of the invention.

FIG. 2 illustrates a decoding matrix 200 used for decoding data according to one embodiment of the invention. The decoding matrix 200 represents an example decoding matrix H, which has a column weight of four as H is a quasi-cyclic (QC) LDPC matrix (i.e., four layers, which may be referred to as layers $H_1$, $H_2$, $H_3$, and $H_4$) and includes multiple sub-matrixes, such as sub-matrixes 202, 204, 206, and 208, which may be termed P sub-matrixes. The column weigh may vary if other types of H matrixes are used. The multiple sub-matrixes may each have a size of P bits×P bits. P may be an integer value, for example, such as 128, 256, 350, 512, 1024, etc. The multiple sub-matrixes can be identity matrixes rotated by values where each row of one sub-matrix is shifted or rotated by the same number of columns (e.g., each sub-matrix can be a circulant matrix). The decoding matrix 200 further has a row weight. The row weight can equal the number of sub-matrixes per layer in the case of a QC-LDPC matrix. Other cases may have a different row weight depending on the type of matrixes used. In some embodiments, the decoding matrix 200 may not include a NULL sub-matrix. Although the decoding matrix 200 is illustrated with a column weight equal to four, in some embodiments, the decoding matrix 200 can have a column weight less than or greater than four, such as a column weight equal to three or five, for example. Each different decoding matrix size can correspond to and enable decoding of data units having different amounts of parity.

The decoding matrix 200 can be used in layered, iterative quasi-cyclic LDPC decoding where a layered approach or layer decoding operations are used to decode data retrieved from a storage medium. The retrieved data can be input to a decoder, such as the decoder module 132, in portions having a length equal to one of multiple code word lengths. The row weight of the decoding matrix can equal the code word length for encoded data in terms of a number of sub-matrixes in the decoding matrix. By changing the P sub-matrix size or column weight of the decoding matrix used to decode data, data having different code rates can be decoded. By changing the row weight of the decoding matrix used to decode data, data for different memory page formats can be coded. In some embodiments, the code word length used to decode data can depend on an E-page size (e.g., an error correcting code page size or a defined grouping of memory for a non-volatile memory array) or NAND flash page size of a memory of a data storage system, such as the data storage system 120.

The decoding matrix 200 can be used in solving a minimum-sum (min-sum) algorithm. As part of the min-sum algorithm, $R_{mj}$ may be defined to denote a check node log-likelihood ratio (LLR) message sent from a check node m to a variable node j. $L(q_{mj})$ may be defined to denote a variable node LLR message sent from the variable node j to the check node m. $L(q_j)(j=1, \ldots, N)$ may be defined to represent the a posteriori probability ratio (APP messages) for the variable nodes. The APP messages can be initialized with the corresponding a priori (channel) reliability value of the coded bit j. For each variable node j of a current horizontal layer of the decoding matrix 200, messages $L(q_{mj})$ that correspond to a particular check equation m are computed according to Equation 1.

$$L(q_{mj}) L(q_j) - R_{mj} \qquad (1)$$

For each check node m, message $R_{mj}$, which can correspond to all variable nodes j that participate in a parity check equation, can be computed according to Equation 2.

$$R_{mj} \approx \pi_{j' \in N(m) \setminus [j]} \text{sign}(L(qmj')) \times (\min_{j' \in N(m) \setminus [j]} |L(qmj')|) \qquad (2)$$

The a posteriori probability APP messages in the current horizontal layer can be updated according to Equation 3.

$$L(q_j) = L(q_{mj}) + R_{mj} \qquad (3)$$

A decision can be made after processing each horizontal layer of the decoding matrix 200 based on the sign of L(q), j=1, . . . , N. If all parity check equations are satisfied, the decoding algorithm may stop. Otherwise, the min-sum algorithm of Equations 1, 2, and 3 can be repeated for a next horizontal layer.

In some embodiments, the parity check equation used to determine whether data was successfully decoded using one horizontal layer of the decoding matrix 200 can be Equation 4.

$$C \cdot H_n^T = 0 \quad (4)$$

Equation 4 includes a matrix multiplication of a data portion or code word C and a transpose of the one horizontal layer $H_n$ of the decoding matrix 200. The parity check of Equation 4 can be satisfied when the result of the matrix modification is zero, and thus the data portion C may have been successfully decoded using the one horizontal layer $H_n$ when the result is zero.

The decoding matrix 200 can be further used in iteratively solving the min-sum algorithm. The decoding algorithm can be performed once for all layers of the decoding matrix 200 (e.g., one iteration of the decoding algorithm can be performed). If one or more parity check equations are not satisfied for at least one layer, the decoding algorithm can be performed again (e.g., another iteration of the decoding algorithm can be performed). In some embodiments, decoding algorithm can additionally or alternatively be performed until a predetermined maximum number of iterations is reached. The maximum number of iterations may be determined based on a number of iterations historically used to successfully decode data, a desired throughput, or power constraints, for instance.

Decoder Having Early Decoding Termination Detection

Figure 3:
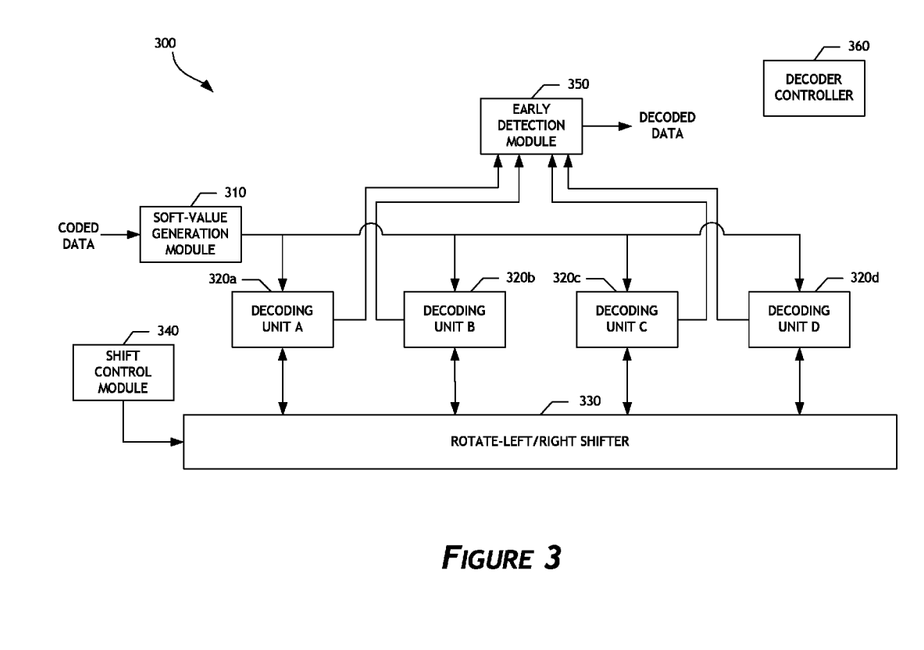
FIG. 3 illustrates a block diagram of a decoder according to one embodiment of the invention.

FIG. 3 illustrates a block diagram of a decoder 300 according to one embodiment of the invention. The decoder 300 can be a quasi-cyclic decoder, such as a quasi-cyclic low-density parity check (LDPC) decoder. The decoder 300 may correspond to the decoder module 132 of FIG. 1. The decoder 300 includes a decoder controller 360 that can manage operations of components of the decoder 300, as well as data exchange and iteration control. In some embodiments, the decoder controller 360 may be a separate lower-level controller from the controller 130 of FIG. 1. In other embodiments, the decoder controller 360 can be a part of the controller 130.

The decoder 300 includes a soft-value generation module 310 and multiple decoding units, including decoding unit A 320a, decoding unit B 320b, decoding unit C 320c, and decoding unit D 320d (collectively, decoding units 320). The soft-value generation module 310 can receive coded data retrieved from a storage medium and generate soft values (e.g., log-likelihood values or scaled values) as inputs for the decoding units 320. In some embodiments, the soft-value generation module 310 constructs soft values by reading the same memory page multiple times with different conditions (e.g., an adjusted voltage read threshold). The multiple read results can be combined in such a way that a final fixed-point represents a probability of 1 or 0. Further, in some embodiments, the soft-value generation module 310 can additionally or alternatively provide binary inputs to the decoding units 320. The soft-value generation module 310 may input data units having one of multiple code word lengths to the decoding units 320 for processing. Each decoding unit may include one or more memories (not shown) for storing a portion of or the entire data unit received from the soft-value generation module 310.

The decoding units 320 can be configured to iteratively decode data units according to a min-sum algorithm, such as based on Equations 1, 2, and 3. The decoding units 320 can decode data units that are encoded using one of multiple code word lengths or processing unit lengths. The decoding units 320 can operate in conjunction with rotate-left/right shifter 330 and the shift control module 340 to perform layer decoding operations using one of multiple decoding matrixes, such as the decoding matrix 200. After decoding using each layer or performing each layer decoding operation, the decoding units 320 can determine a minimum calculated value for each layer from the min-sum algorithm to determine a global minimum (e.g., a minimum of the minimums) for each layer. The global minimums for the layers can then be compared to determine a lowest or global minimum for all layers. The decoding units 320 can include one or more working memories (not shown) to store minimum calculated values or data during the decoding process, for example.

The decoding units 320 can be configured to decode subsets of a data unit in parallel or substantially in parallel using subsets of a corresponding decoding matrix. In some embodiments, the decoding units 320 can each have a processing capacity of soft values or bits per clock cycle corresponding to the size of a smallest P sub-matrix size of a decoding matrix that is supported by the decoder 300. For example, the decoding units 320 can each process 256 soft values, 512 soft values, or 1024 soft values subsets of the data unit per clock cycle when the size of the smallest P sub-matrix size supported is 256 bits×256 bits, 512 bits×512 bits, or 1024 bits×1024 bits, respectively. The decoding units 320 may share values determined as part of a layer decoding operation, such as local determined minimums from decoding subsets of one layer of a data unit, to facilitate the parallel decoding and determining of a minimum calculated value for each layer. In some embodiments, one or more of the decoding units 320 share values when processing a data unit having one length and not another length.

The rotate-left/right shifter 330 can be configured to shift or rotate (e.g., to the left or the right) soft values or bits of portions of data units according to instructions from the shift control module 340. The shift control module 340 can determine or look-up a corresponding decoding matrix from a memory (not shown) for decoding particular data units. Based on the corresponding decoding matrix, the shift control module 340 can direct the rotate-left/right shifter 330 to process data units using a particular granularity and shift portions of data units an amount based on the size and contents of sub-matrixes of a decoding matrix used to decode data units (e.g., a P sub-matrix size and rotation of an identity matrix). In some embodiments, the rotate-left/right shifter 330 can be a configurable Benes network or group of shift registers, and the rotate-left/right shifter 330 may support input data sizes of at least 256 soft values, 512 soft values, and 1024 soft values, for instance. In such embodiments, the Benes network can further include one or more smaller Benes networks connected to one another so as to function as a larger Benes network. In some example operations of the rotate-left/right shifter 330, the rotate-left/right shifter 330 can shift data unit portions having a size of 256 soft values, 512 soft values, or 1024 soft values. In a simple, illustrative example operation of the rotate-left/right shifter 330 shown below, the rotate-left/right shifter 330 can shift each row of a 1 bit×6 bits matrix one column to the right based on the contents of a sub-matrix of the decoding matrix.

*group of 6 values*
*(shift right 1 position)*

$[b_1 \ b_2 \ b_3 \ b_4 \ b_5 \ b_6] \longrightarrow [b_6 \ b_1 \ b_2 \ b_3 \ b_4 \ b_5]$ The rotate-left/right shifter 330 can shift data unit portions having different sizes or granularities corresponding to a decoding matrix sub-matrix size although the rotate-left/right shifter 330 may have a fixed capacity per clock cycle. The shift control module 340 may direct the rotate-left/right shifter 330 to consider different portions of data processed by the rotate-left/right shifter 330 as different rotation units. Thereby, the shift control module 340 can direct the shifting of different portions of the data independently. In another simple, illustrative example operation of the rotate-left/right shifter 330 shown below, the rotate-left/right shifter 330 can independently shift two 1 bit×3 bits matrixes one column to the right based on the contents of two sub-matrixes of the decoding matrix.

The decoding units 320 can output results, such as decoded data, from one or more layer decoding operations to an early detection module 350. The early detection module 350 can determine whether to terminate further iterations of decoding the data unit based on whether parity check equations, such as the parity check of Equation 4, are satisfied by the results and the layers of the decoding matrix. The early detection module 350 can operate in parallel or substantially in parallel with the decoding units 320 and stop decoding by the decoding units 320 once the early detection module 350 determines that the parity check equations are satisfied. The early detection module 350 can evaluate the parity check equations after decoding using one or more layers or after performing one or more iterations of decoding using all layers of the decoding matrix. In some embodiments, the early detection module 350 evaluates the parity check equations after each iteration of decoding using all layers of the decoding matrix due to throughput budget considerations. The parity check equations may be evaluated while decoded data is in a rotated order other than an original order of the data before it was encoded. Further, the early detection module 350 can be used to rotate decoded data back to the original order of the data before it was encoded. In some embodiments, the early detection module 350 can include one or more early detection sub-modules where each sub-module can process the results and one layer of the decoding matrix in parallel or substantially in parallel. In such embodiments, some early detection sub-modules may be external to the decoder 300 and can be invoked to perform early detection after the early detection sub-modules of the decoder 300 determine that the data results and layers of the decoding matrix processed by those sub-modules satisfy the parity check equation.

The early detection module 350 can in addition stop early termination detection if the results and one layer of the decoding matrix do not satisfy a parity check equation. When the results and one layer do not satisfy the parity check equation, the early detection module 350 may determine that the decoding units 320 did not successfully decode the data during the completed decoding iteration and thus may continue decoding the data. Accordingly, the early detection module 350 may save power and processing time by not performing further early termination detection for the completed decoding iteration.

In some embodiments, a number of decoding units and/or early detection sub-modules can be selected in accordance with a desired throughput. For example, the number of decoder units can be 1, 2, 3, or 4 (as illustrated in FIG. 3), and so on. Similarly, the early detection sub-modules can be 1 (as illustrated in FIG. 3), 2, 3, or 4, and so on. In one embodiment, the upper limit on the number of decoder units and/or early detection sub-modules can be selected as the number of sub-matrixes in one or more decoding matrixes which are supported by one or more of the decoding units 320, the rotate-left/right shifter 330, or the early detection module 350.

Figure 4:
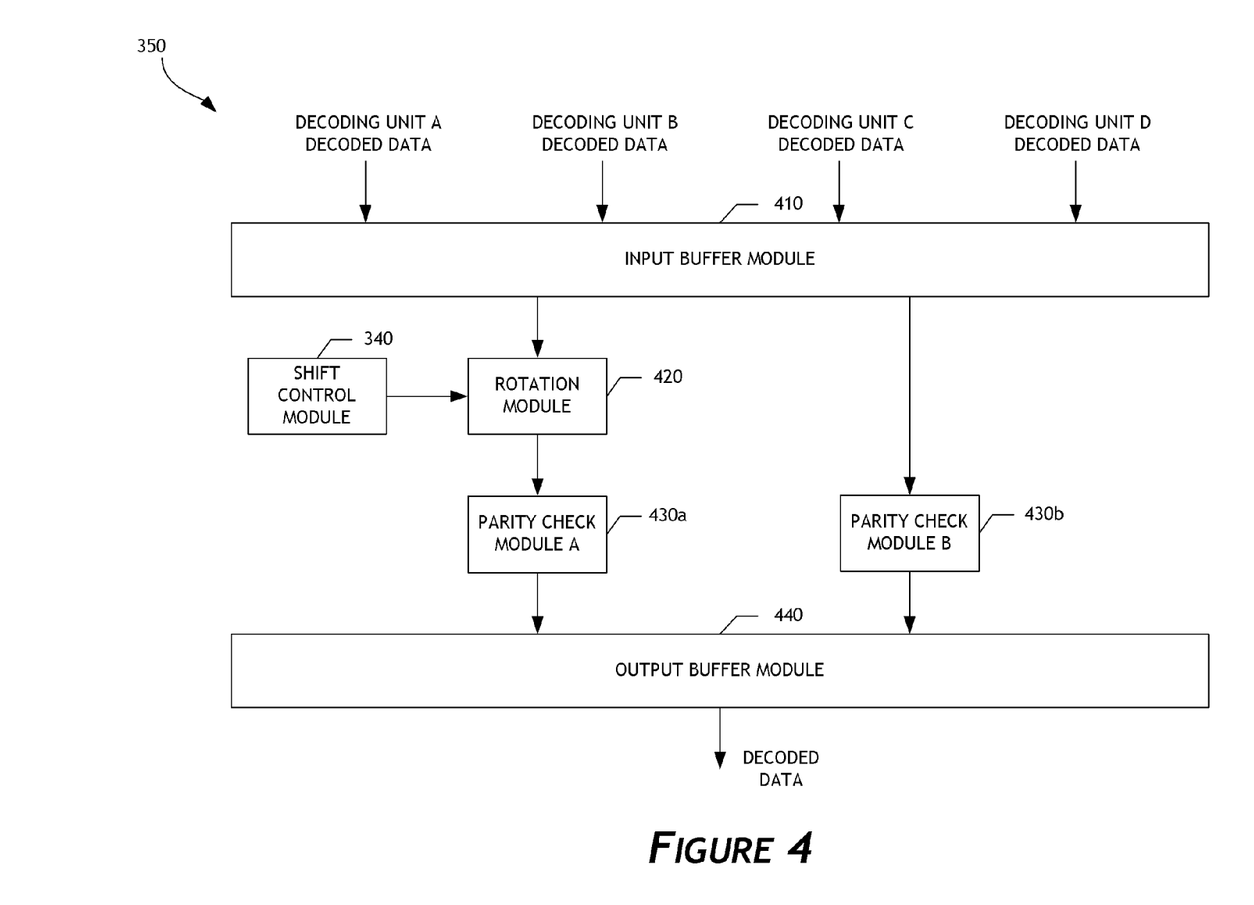
FIG. 4 illustrates a block diagram of an early detection module according to one embodiment of the invention.

FIG. 4 illustrates a block diagram of the early detection module 350 of FIG. 3 according to one embodiment of the invention. The early detection module 350 may advantageously enable early termination of iterative decoding of data once the data may have successfully been decoded. The termination of the decoding can reduce number of iterations performed to decode the data.

The early detection module 350 includes an input buffer module 410 that can receive decoded data from the decoding units 320 of FIG. 3. The input buffer module 410 can store the received decoded data and provide portions of the decoded data to a rotation module 420 or a parity check module B 430b. Since the data stored in the input buffer module 410 may be rotated in an order based on a last layer of decoding with a decoding matrix, the input buffer module 410 can provide the data portions to the rotation module 420 when the early detection module 350 processes the data portions using layers of the decoding matrix other than the last layer. On the other hand, when the early detection module 350 processes the data portions using the last layer of the decoding matrix, the early detection module 350 can instead input the data portions to the parity check module B 430b.

The rotation module 420, under the control of the shift control module 340, can rotate or align the received data portions for evaluation by the parity check module A 430a. The rotation module 420 can function similarly to the rotate-left/right shifter 330 of FIG. 3. The rotation module 420 can be configured to shift or rotate the portions according to instructions from the shift control module 340. The shift control module 340 can determine or look-up a corresponding decoding matrix from a memory (not shown) that was used for decoding the data. Based on the corresponding decoding matrix, the shift control module 340 can direct the rotation module 420 to process data using a particular granularity and shift portions of the data an amount based on the size and contents of sub-matrixes of a decoding matrix used to decode the data. In some embodiments, the rotation module 420 can be a configurable Benes network or group of shift registers, and the rotation module 420 may support input matrix sizes of at least 1 bit×256 bits, 1 bit×512 bits, and 1 bit×1024 bits, for instance. In such embodiments, the Benes network can further include one or more smaller Benes networks connected to one another so as to function as a larger Benes network. Further, the rotation module 420 can rotate portions of data by amounts based on a comparison between a rotation of a current layer relative to a previous layer. In one example operation of the rotation module 420, the rotation module 420 can shift data portions having a size of 1 bit×256 bits, 1 bit×512 bits, or 1 bit×1024 bits.

The rotation module 420 can shift data portions having different sizes or granularities corresponding to a decoding matrix sub-matrix size although the rotation module 420 may have a fixed capacity per clock cycle. The shift control module 340 may direct the rotation module 420 to consider different portions of data processed by the rotation module 420 as different rotation units. Thereby, the shift control module 340 can direct the shifting of different portions of the data independently as discussed with respect to the rotate-left/right shifter 330. In some embodiments, the shift control function performed by the shift control module 340 of the early detection module 350 of FIG. 4 is performed by a shift controller other than the shift control module 340 of the decoder 300 of FIG. 3.

The parity check module A 430a and the parity check module B 430b (collectively, parity check modules 430) can be configured to perform an exclusive-or operation for the received data portions. The exclusive-or operation can provide an indication of whether the data portion and the corresponding portion of a layer satisfy the parity check equation, such as Equation 4. In one example, assuming the rotation module 420 has a capacity of 1 bit×1024 bits, the parity check modules 430 may operate using the following pseudocode when processing a decoding matrix that includes sub-matrixes having a size of 256 bits×256 bits. Each of the parity check modules 430 can process four 1 bit×256 bits portions of decoded data per clock cycle in this example.

Flag=0;
    For (i=0; i<256; i++)
    {Flag=Flag OR (Bit[i] ^ Bit[i+256] ^ Bit[i+512] ^ Bit[i+768]);}

In another example, assuming the rotation module 420 has a capacity of 1 bit×1024 bits, the parity check modules 430 may operate using the following pseudocode when processing a decoding matrix that includes sub-matrixes having a size of 512 bits×512 bits. Each of the parity check modules 430 can process two 1 bit×512 bits portions of decoded data per clock cycle in this example.

Flag=0;
    For (i=0; i<512; i++)
    {Flag=Flag OR (Bit[i] ^ Bit[i+512]);}

In yet another example, assuming the rotation module 420 has a capacity of 1 bit×1024 bits, the parity check modules 430 may operate using the following pseudocode when processing a decoding matrix that includes sub-matrixes having a size of 1024 bits×1024 bits. Each of the parity check modules 430 can process one 1 bit×1024 bits portions of decoded data per clock cycle in this example.

Flag=0;
    For (i=0; i<1024; i++)
    {Flag=Flag OR (Bit[i]);}

When the parity check modules 430 determine that the results and each layer of the decoding matrix satisfy the parity check equation, the parity check module A 430a or the parity check module B 430b can provide the successfully decoded data to the output buffer module 440. The output buffer module 440, in turn, can store and/or output the decoded data for further processing, such as for shortening, re-aligning, or storing to other memory. Further, when the parity check modules 430 determine that the results and each layer of the decoding matrix satisfy the parity check equation, the parity check modules 430 can set a flag or send a signal to the decoding units 322 to stop decoding of the data subsets and begin decoding of next data subsets.

Although not illustrated in FIG. 4, one or more additional rotation modules, such as rotation module 420, or parity check modules, such as the parity check module A 430a or the parity check module B 430b, can be included in the early detection module 350. The additional modules can facilitate further parallel processing of decoded data by the early detection module 350 at the cost of additional software and/or hardware. In addition, in some embodiments, the early detection module 350 may not include the rotation module 420, parity check module A 430a, or parity check module B 430b, and may instead perform the early detection function serially.

Early Decoding Termination Detection Processes

Figure 5:
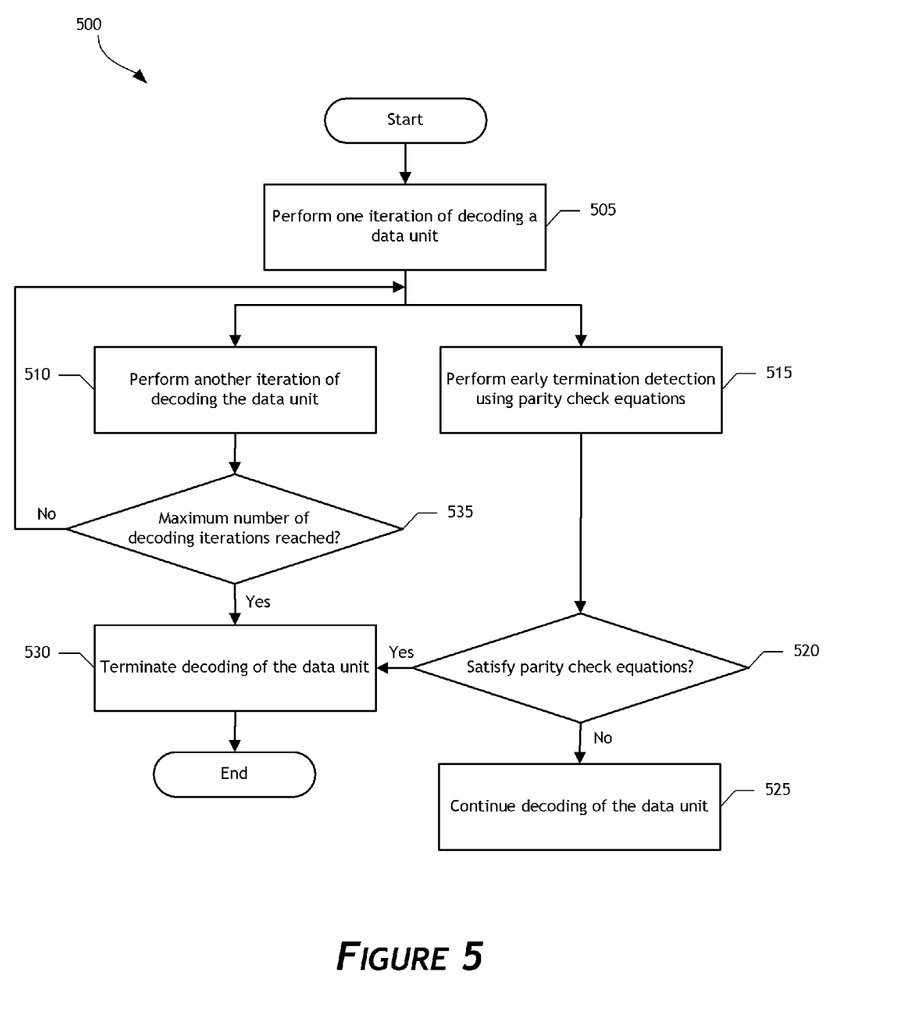
FIG. 5 is a flow diagram illustrating a decoding process with early decoding termination detection according to one embodiment of the invention.

FIG. 5 is a flow diagram illustrating a decoding process 500 with early decoding termination detection according to one embodiment of the invention. In some embodiments, the controller 130 and/or decoder module 132 of FIG. 1 are configured to perform the process 500.

At block 505, the process 500 performs one iteration of decoding the data unit. For example, the decoding units 320 of FIG. 3 can decode the data unit using all layers of the decoding matrix, such as the decoding matrix 200 of FIG. 2. At block 510, the process 500 performs another iteration of decoding the data unit. For instance, the decoding units 320 can again decode the data unit using all layers of the decoding matrix 200. In parallel or simultaneous to the actions at block 510, the process 500 performs early termination detection using parity check equations at block 515. At block 520, the process 500 determines whether the parity check equations are satisfied as further illustrated by the example in FIG. 6. If the parity check equations are not satisfied, the process 500 continues decoding the data unit at block 525. On the other hand, if the parity check equations are satisfied, the process 500 moves to block 530 and terminates decoding of the data unit.

At block 535, the process 500 determines whether a maximum number of decoding iterations has been reached. If the maximum number of decoding iterations has been reached, at block 530, the process 500 terminates decoding of the data unit. On the other hand, if the maximum number of decoding iterations has not been reached, the process 500 moves to blocks 510 and 515. At block 510, the process 500 again performs another iteration of decoding the data unit. At block 515, the process 500 again performs early termination detection using the parity check equations; however, the process 500 now performs early termination detection based on the decoded data from the previous another iteration of decoding the data unit at block 510.

Figure 6:
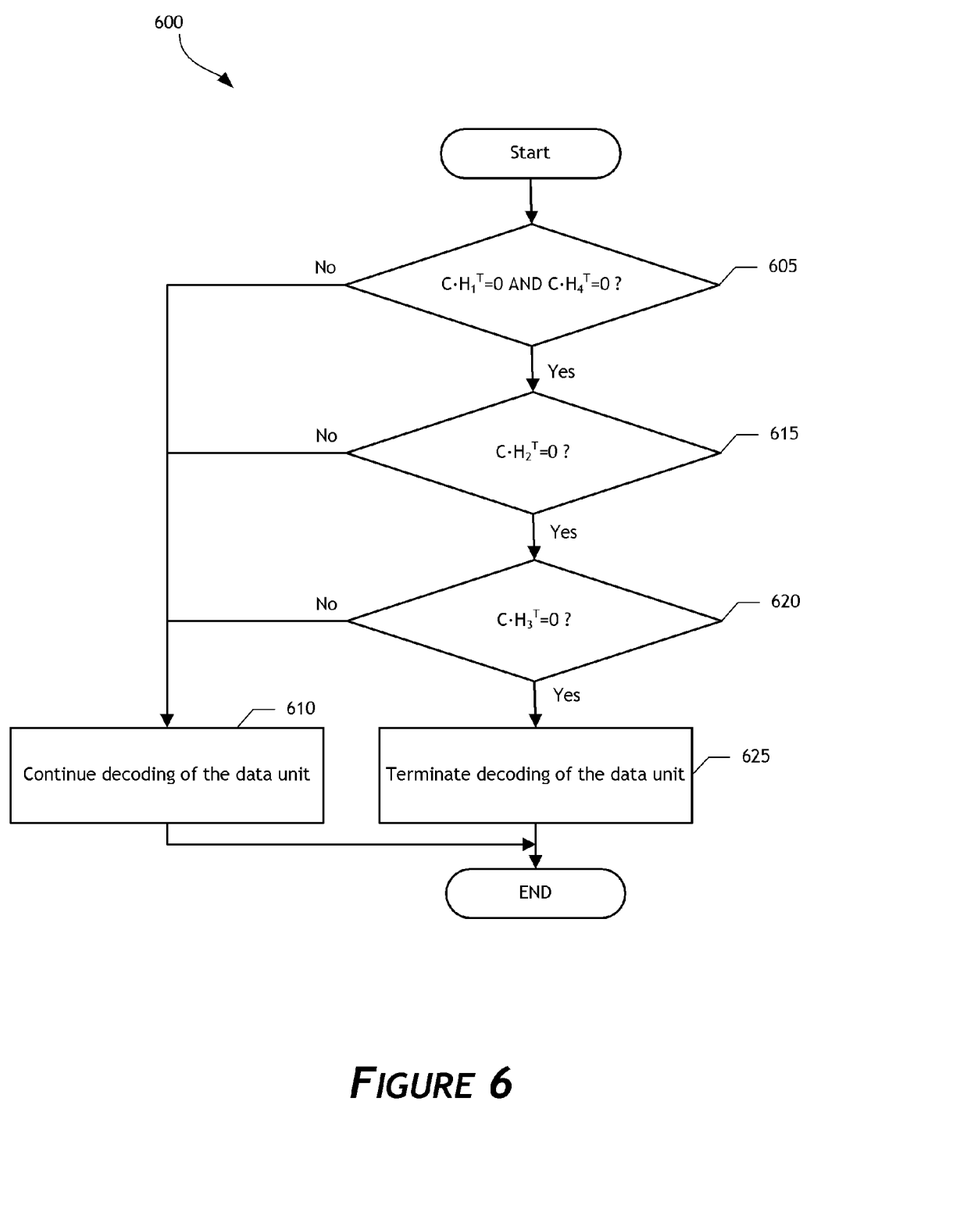
FIG. 6 is a flow diagram illustrating a process of early decoding termination detection according to one embodiment of the invention.

FIG. 6 is a flow diagram illustrating a process 600 of early decoding termination detection according to one embodiment of the invention. In some embodiments, the controller 130 and/or decoder module 132 of FIG. 1 are configured to perform the process 600.

At block 605, the process 600 determines whether two parity check equations are satisfied. One parity check equation is satisfied when the matrix multiplication of a decoded data unit C and the transpose of one layer $H_1$ of a decoding matrix equals zero ($C \cdot H_1^T = 0$). The other parity check equation is satisfied when the matrix multiplication of the decoded data unit C and the transpose of another layer $H_4$ of the decoding matrix equals zero ($C \cdot H_4^T = 0$). In some embodiments, the one layer $H_1$ can be a first layer of the decoding matrix, and the another layer $H_4$ can be a last layer of the decoding matrix. If either or both parity check equations at block 605 are not satisfied, the process 600 moves to block 610 and continues decoding of the data unit. If both parity check equations at block 605 are satisfied, the process 600 moves to block 615. At block 615, the process 600 determines whether another parity check equation is satisfied. The another parity check equation is satisfied when the matrix multiplication of the decoded data unit C and the transpose of one layer $H_2$ of the decoding matrix equals zero ($C \cdot H_2^T = 0$). If the another parity check equation is not satisfied, the process 600 moves to block 610. If the another parity check equation is satisfied, the process 600 moves to block 620 and determines whether a further parity check equation is satisfied. The further parity check equation is satisfied when the matrix multiplication of the decoded data unit C and the transpose of one layer $H_3$ of the decoding matrix equals zero ($C \cdot H_3^T = 0$). If the further parity check equation is not satisfied, the process 600 moves to block 610. If the further parity check equation is satisfied, the process 600 moves to block 625. At block 625, the process 600 terminates decoding of the data unit.

Figure 7:
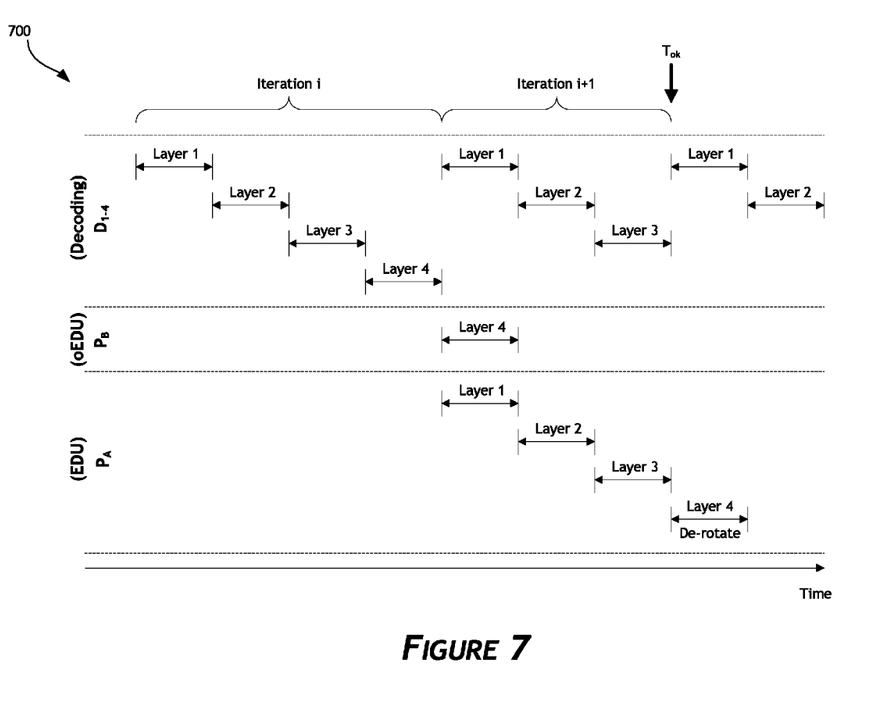
FIG. 7 is a timing diagram illustrating timings for a decoding process and an early decoding termination detection process according to one embodiment of the invention.

FIG. 7 is a timing diagram 700 illustrating timings for a decoding process and an early decoding termination detection process according to one embodiment of the invention. The timing diagram 700 illustrates decoding and early decoding termination detection using a decoding matrix having four layers. The portion of the timing diagram 700 labeled as Decoding $D_{1-4}$ corresponds to decoding operations performed by decoding units, such as the decoding units 320 of FIG. 3. The portion of the timing diagram 700 labeled as oEDU (outside or external early detection unit) $P_B$ corresponds to early decoding termination detection performed by the parity check module B 430b of FIG. 4. The portion of the timing diagram 700 labeled as EDU (early detection unit) $P_A$ corresponds to early decoding termination detection performed by parity check module a 430a of FIG. 4. In some embodiments, the controller 130 and/or decoder module 132 of FIG. 1 are configured to perform the process 700.

The timing diagram 700 first illustrates an iteration i of decoding a data unit. The decoding iteration i begins by decoding the data unit using Layer 1 of a decoding matrix. Subsequently, the iteration i continues with individually decoding of the data unit using Layers 2, 3, and 4. After completion of the iteration i, a next iteration i+1 of decoding the data unit begins, and the decoded data unit from the iteration i is transmitted for early decoding termination detection.

In parallel with decoding the data unit using Layer 1 during iteration i+1, early decoding termination detection begins with evaluating the decoded data unit and Layers 1 and 4 in parallel. As illustrated in the timing diagram 700, the parity check equations are satisfied for both early decoding termination detections for Layers 1 and 4, so the early decoding termination detection process continues with one or more other layers of the decoding matrix. In parallel with decoding the data unit using Layer 2 during iteration i+1, the early decoding termination detection begins with evaluating the decoded data unit and Layer 2. As illustrated, the parity check equation is satisfied for the early decoding termination detection for Layer 2, so the early decoding termination detection process continues. In parallel with decoding the data unit using Layer 3 during iteration i+1, the early decoding termination detection begins with evaluating the decoded data unit and Layer 3. As illustrated, the parity check equation is satisfied for the early decoding termination detection for Layer 3, so the early decoding termination detection has been satisfied for all layers and decoding of the data unit can stop. As illustrated, decoding of the data unit during iteration i+1 using Layer 4 may not be performed. Beginning at time $T_{ok}$, another data unit can instead be decoded using Layer 1 of the same or a different decoding matrix. Simultaneously, the data stored for early decoding termination detection can be de-rotated to an original order of the decoded data before the data was encoded since the data has now been determined to be successfully decoded. In some embodiments, the data may be de-rotated by initiating or performing early decoding termination detection using Layer 4 with the rotation module 420 and the parity check module A 430a, causing the data to be rotated back to the original order.

Other Variations

Those skilled in the art will appreciate that in some embodiments, other suitable error correction mechanisms can be used in addition to and/or in place of LDPC coding. For example, Hamming coding, turbo coding, BCH coding, and the like can be used. Further, any suitable unit or grouping of data, such as octet, nibble, word, byte, etc., can be used in addition to or in place of a bit of user data. Moreover, the actual steps taken in the disclosed processes, such as the processes illustrated in FIGS. 5 and 6, may differ from those shown in the Figures. Additional system components can be utilized, and disclosed system components can be combined or omitted. Depending on the embodiment, certain of the steps described above may be removed, others may be added. Accordingly, the scope of the present disclosure is intended to be defined only by reference to the appended claims.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage system, comprising:
a non-volatile memory array; and
a controller configured to:
    iteratively decode a first data unit of a plurality of data units, the plurality of data units read from the non-volatile memory array, using a plurality of layers of a coding matrix at least by:
        performing a first decoding iteration on the first data unit using the plurality of layers to generate a decoded first data unit, and
        performing a second decoding iteration on the decoded first data unit using the plurality of layers;
    determine, in parallel with performing the second decoding iteration, whether the decoded first data unit generated by the first decoding iteration and one or more layers of the plurality of layers satisfy a parity check equation;
    in response to determining that the decoded first data unit and a first layer of the one or more layers do not satisfy the parity check equation:

skip determining whether the decoded first data unit and at least one layer of the plurality of layers other than the one or more layers satisfy the parity check equation, and continue performing the second decoding iteration on the decoded first data unit; and in response to determining that the decoded first data unit and each layer of the plurality of layers satisfy the parity check equation, terminate iteratively decoding the first data unit.

2. The data storage system of claim 1, wherein the controller is further configured to, in response to determining that the decoded first data unit and the first layer satisfy the parity check equation, determine whether the decoded first data unit and a second layer of the one or more layers satisfy the parity check equation.

3. The data storage system of claim 1, wherein the controller is further configured to, in parallel with determining whether the decoded first data unit and the first layer satisfy the parity check equation using first parity check computer hardware, determine whether the decoded first data unit and a second layer of the one or more layers satisfy the parity check equation using second parity check computer hardware different from the first parity check computer hardware.

4. The data storage system of claim 1, wherein the controller is further configured to iteratively decode a second data unit of the plurality of data units in response to determining that the decoded first data unit and each layer of the plurality of layers satisfy the parity check equation.

5. The data storage system of claim 1, wherein the controller is further configured to direct a rotate-left/right shifter to rotate data of the decoded first data unit before determining whether the decoded first data unit and the one or more layers satisfy the parity check equation.

6. The data storage system of claim 5, wherein the controller is configured to direct the rotate-left/right shifter to rotate the data of the decoded first data unit by an amount of rotation based on a comparison between a current layer and a previous layer, the rotate-left/right shifter comprising a Benes network.

7. The data storage system of claim 5, wherein the controller is configured to direct the rotate-left/right shifter to process the decoded first data unit using a granularity corresponding to a first matrix size of a plurality of matrix sizes, the rotate-left/right shifter supporting granularities corresponding to each of the plurality of matrix sizes.

8. The data storage system of claim 5, wherein the controller is further configured to direct the rotate-left/right shifter to de-rotate the data of the decoded first data unit in response to determining that the decoded first data unit and each layer of the plurality of layers satisfy the parity check equation.

9. The data storage system of claim 1, wherein the parity check equation comprises a matrix multiplication of the decoded first data unit and a transpose of one layer of the plurality of layers, the decoded first data unit and the transpose of the one layer satisfying the parity check equation when a result of the matrix multiplication is zero.

10. The data storage system of claim 1, wherein the plurality of data units comprise a plurality of low-density parity-check (LDPC) data units, and the coding matrix comprises a plurality of sub-matrixes, the plurality of sub-matrixes comprising identity matrixes rotated by values.

11. In a data storage system comprising a controller, a method of decoding data performed under control of the controller, the method comprising:

iteratively decoding a first data unit of a plurality of data units, the plurality of data units read from a non-volatile memory array, using a plurality of layers of a coding matrix at least by:

performing a first decoding iteration on the first data unit using the plurality of layers to generate a decoded first data unit, and performing a second decoding iteration on the decoded first data unit using the plurality of layers;

determining, in parallel with performing the second decoding iteration, whether the decoded first data unit generated by the first decoding iteration and one or more layers of the plurality of layers satisfy a parity check equation;

in response to determining that the decoded first data unit and a first layer of the one or more layers do not satisfy a parity check equation:

skipping determining whether the decoded first data unit and at least one layer of the plurality of layers other than the one or more layers satisfy the parity check equation, and continuing performing the second decoding iteration on the decoded first data unit; and in response to determining that the decoded first data unit and each layer of the plurality of layers satisfy the parity check equation, terminating iteratively decoding of the first data unit.

12. The method of claim 11, further comprising, in response to determining that the decoded first data unit and the first layer satisfy the parity check equation, determining whether the decoded first data unit and a second layer of the one or more layers satisfy the parity check equation.

13. The method of claim 11, further comprising, in parallel with determining whether the decoded first data unit and the first layer satisfy the parity check equation using first parity check computer hardware, determining whether the decoded first data unit and a second layer of the one or more layers satisfy the parity check equation using second parity check computer hardware different from the first parity check computer hardware.

14. The method of claim 11, further comprising iteratively decoding a second data unit of the plurality of data units in response to determining that the decoded first data unit and each layer of the plurality of layers satisfy the parity check equation.

15. The method of claim 11, further comprising directing a rotate-left/right shifter to rotate data of the decoded first data unit before determining whether the decoded first data unit and the one or more layers satisfy the parity check equation.

16. The method of claim 15, further comprising directing the rotate-left/right shifter to rotate the data of the decoded first data unit by an amount of rotation based on a comparison between a current layer and a previous layer, the rotate-left/right shifter comprising a Benes network.

17. The method of claim 15, further comprising directing the rotate-left/right shifter to process the decoded first data unit using a granularity corresponding to a first matrix size of a plurality of matrix sizes, the rotate-left/right shifter supporting granularities corresponding to each of the plurality of matrix sizes.

18. The method of claim 15, further comprising directing the rotate-left/right shifter to de-rotate the data of the decoded first data unit in response to determining that the decoded first data unit and each layer of the plurality of layers satisfy the parity check equation.

19. The method of claim 11, wherein the parity check equation comprises a matrix multiplication of the decoded first data unit and a transpose of one layer of the plurality of layers, the decoded first data unit and the transpose of the one layer satisfying the parity check equation when a result of the matrix multiplication is zero.

20. The method of claim 11, wherein the plurality of data units comprise a plurality of low-density parity-check (LDPC) data units, and the coding matrix comprises a plurality of sub-matrixes, the plurality of sub-matrixes comprising identity matrixes rotated by values.

* * * * *